US009330982B1

(12) United States Patent
Cao et al.

(10) Patent No.: US 9,330,982 B1
(45) Date of Patent: May 3, 2016

(54) SEMICONDUCTOR DEVICE WITH DIFFUSION BARRIER FILM AND METHOD OF MANUFACTURING THE SAME

(71) Applicant: GLOBALFOUNDRIES Inc., Grand Cayman (KY)

(72) Inventors: Huy Cao, Rexford, NY (US); Songkram Srivathanakul, Waterford, NY (US); Jinping Liu, Ballston Lake, NY (US); In Soo Jung, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/826,276

(22) Filed: Aug. 14, 2015

(51) Int. Cl.
*H01L 21/8238* (2006.01)
*H01L 21/02* (2006.01)
*H01L 21/324* (2006.01)
*H01L 27/092* (2006.01)

(52) U.S. Cl.
CPC .. *H01L 21/823807* (2013.01); *H01L 21/02118* (2013.01); *H01L 21/02126* (2013.01); *H01L 21/02274* (2013.01); *H01L 21/324* (2013.01); *H01L 21/823821* (2013.01); *H01L 27/0924* (2013.01)

(58) Field of Classification Search
CPC ............. H01L 21/82341; H01L 21/82381; H01L 21/845; H01L 27/0886; H01L 27/0924; H01L 27/10829; H01L 27/10879; H01L 27/1211; H01L 29/41791; H01L 29/66795; H01L 29/7831; H01L 29/785; H01L 2924/13067
USPC .......................................... 257/369; 438/199
See application file for complete search history.

(56) References Cited

U.S. PATENT DOCUMENTS

2014/0239354 A1* 8/2014 Huang .............. H01L 29/66545
257/288

* cited by examiner

*Primary Examiner* — Selim Ahmed
(74) *Attorney, Agent, or Firm* — Ditthavong & Steiner, P.C.

(57) ABSTRACT

A method of forming a diffusion barrier film over fins and the resulting device are provided. Embodiments include forming silicon fins over a substrate; depositing a borosilicate glass (BSG) liner cap over a first set of the silicon fins; depositing a phosphosilicate (PSG) liner cap over a second set of the silicon fins; and depositing a silicon oxycarbide (SiOC) diffusion barrier film over the BSG and PSG liner caps.

20 Claims, 4 Drawing Sheets

SEMICONDUCTOR DEVICE WITH DIFFUSION BARRIER FILM AND METHOD OF MANUFACTURING THE SAME

TECHNICAL FIELD

The present disclosure relates to the manufacture of semiconductor devices including fin-shaped field effect transistors (finFET). In particular, the present disclosure relates to a diffusion barrier film used in manufacturing a semiconductor device in the 14 nm, 10 nm, 7 nm, 5 nm, and 3 nm technology nodes.

BACKGROUND

Existing finFET technology uses a nitride capping layer to cap dopants contained in borosilicate glass (BSG) and phosphosilicate glass (PSG) layers deposited over fins. Some finFET technologies use a silicon oxynitride (SiNO) liner(s) over fins. The nitride capping layer is deposited over the BSG and PSG layers with a low pressure chemical vapor deposition (LPCVD) or at atomic layer deposition (ALD) to a thickness of about 2 nanometers (nm). Problems arise during post processing steps including high temperature annealing and/or high temperature deposition during which the nitride capping layer is consumed and oxidized, thereby rendering the capping layer ineffective in keeping the dopants from diffusing out and being lost. Another problem is the dishing or recessing of a thickness of the fins following chemical mechanical polishing (CMP) as a result of a high removal rate due to insufficient densification of the fins.

A need therefore exists for methodology enabling the application of a diffusion barrier film which can endure post processing steps including CMP, high temperature annealing and/or high temperature deposition and prevent dopants from diffusing out from the fins, and the resulting device.

SUMMARY

An aspect of the present disclosure includes a diffusion barrier film formed over BSG and PSG liner caps that are formed over fins. With the diffusion barrier film of the present invention, the dopants contained in the BSG and PSG can be capped and prevented from diffusing out from the fins during post processing steps including CMP, high temperature annealing and/or high temperature deposition.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming silicon fins over a substrate; depositing a BSG liner cap over a first set of the silicon fins; depositing a PSG liner cap over a second set of the silicon fins; and depositing a silicon oxycarbide (SiOC) diffusion barrier film over the BSG and PSG liner caps.

Aspects include annealing the silicon fins between 500 to 1000° C. Other aspects include depositing the SiOC film with plasma-enhanced chemical vapor deposition (PECVD). Still further aspects include depositing the SiOC film with LPCVD. Additional aspects include depositing a thermal oxide over the silicon fins prior to depositing the BSG and PSG liner caps. Other aspects include depositing a nitride over the thermal oxide prior to depositing the BSG and PSG liner caps. Further aspects include the SiOC diffusion barrier film being a low dielectric constant material. Yet other aspects include depositing the SiOC diffusion barrier film as a conformal layer over the BSG and PSG liner caps. Another aspect includes depositing the SiOC diffusion barrier film to a thickness of 20 to 60 Å. Additional aspects include forming the first set of the silicon fins over a p-well region of the substrate. Other aspects include forming the second set of the silicon fins over an n-well region of the substrate.

Another aspect of the present disclosure is a device including: silicon fins formed over a substrate; a BSG liner cap formed over a first set of the silicon fins; a PSG liner cap formed over a second set of the silicon fins; and a SiOC diffusion barrier film formed over the BSG and PSG liner caps.

Aspects include a thermal oxide formed over the silicon fins under the BSG and PSG liner caps. Other aspects include a nitride formed over the thermal oxide and under the BSG and PSG liner caps. Further aspects include the SiOC diffusion barrier film being a low dielectric constant material. Additional aspects include the SiOC diffusion barrier film being deposited as a conformal layer over the BSG and PSG liner caps. Another aspect includes the SiOC diffusion barrier film being deposited to a thickness of 20 to 60 Å. Another aspect includes the first set of the silicon fins being formed over a p-well region of the substrate. Yet another aspect includes the second set of the silicon fins being formed over an n-well region of the substrate.

Another aspect of the present disclosure is a method including: forming silicon fins over a substrate; depositing a thermal oxide over the silicon fins; depositing a nitride over the thermal oxide; depositing a BSG liner cap over a first set of the silicon fins; depositing a PSG liner cap over a second set of the silicon fins; and depositing a low-k SiOC diffusion barrier film over the BSG and PSG liner caps.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about".

The present disclosure addresses and solves the current problems of dopant diffusion from fins following high temperature post processing steps, as well as dishing/recessing problems as a result of insufficient densification of the fins during post processing deposition. By substituting an SiOC capping layer for a nitride capping layer, dopant diffusion and dishing are eliminated.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
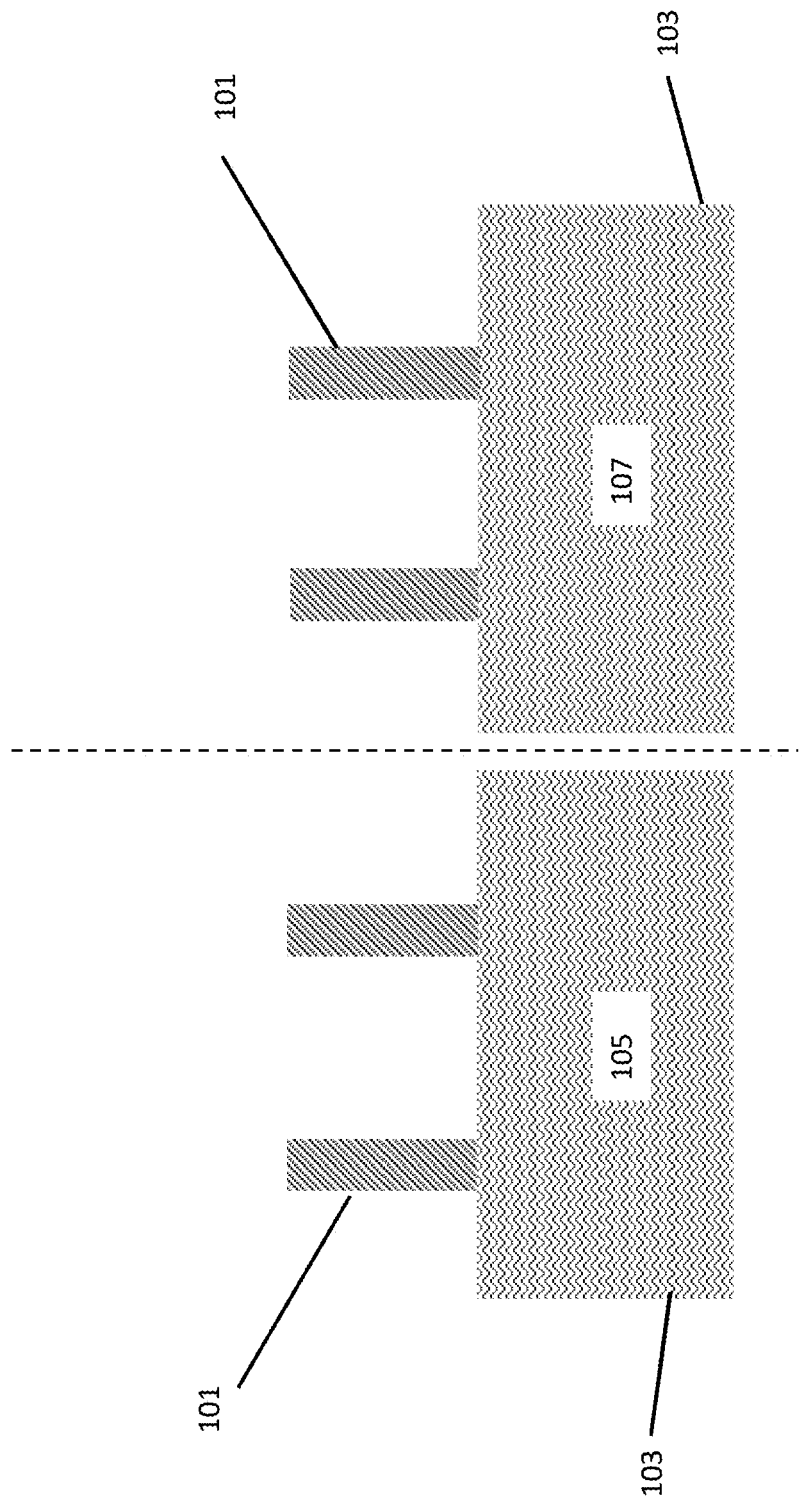
FIGS. 1 through 4 illustrate, in cross sectional view, a process flow to produce a diffusion barrier film over fins, in accordance with an exemplary embodiment.

Adverting to FIG. 1, fins 101 are formed over substrate 103. Substrate 103 includes a silicon substrate. Other examples of materials that may be suitable for use in the substrate 103 include silicon-on-insulator (SOI), silicon-germanium (SiGe), germanium, and/or compound semiconductor materials. Processes, such as, photolithography and etch processes, can be used to create the fins 101. The fins 101 may include silicon.

The fins 101 include the channels of a finFET. The fins 101 may be coupled to the source/drain regions of the finFET. A gate structure (not shown for illustrative convenience) can be formed on and over the fins 101 and spacers may be provided on sides of the gate structure. The gate structure may include polysilicon, silicon-germanium, a metal including metal compounds such as, Mo, Cu, W, Ti, Ta, TiN, TaN, NiSi, CoSi, and/or other suitable conductive materials.

In the example of FIG. 1, the fins 101 formed over region 105 of substrate 103 are to be doped with p-type dopants including boron (B). A positively doped channel is formed in region 105. The fins 101 formed over region 107 of substrate 103 are to be doped with n-type dopants including phosphorous (P). A negatively doped channel is formed in region 107.

Figure 2:
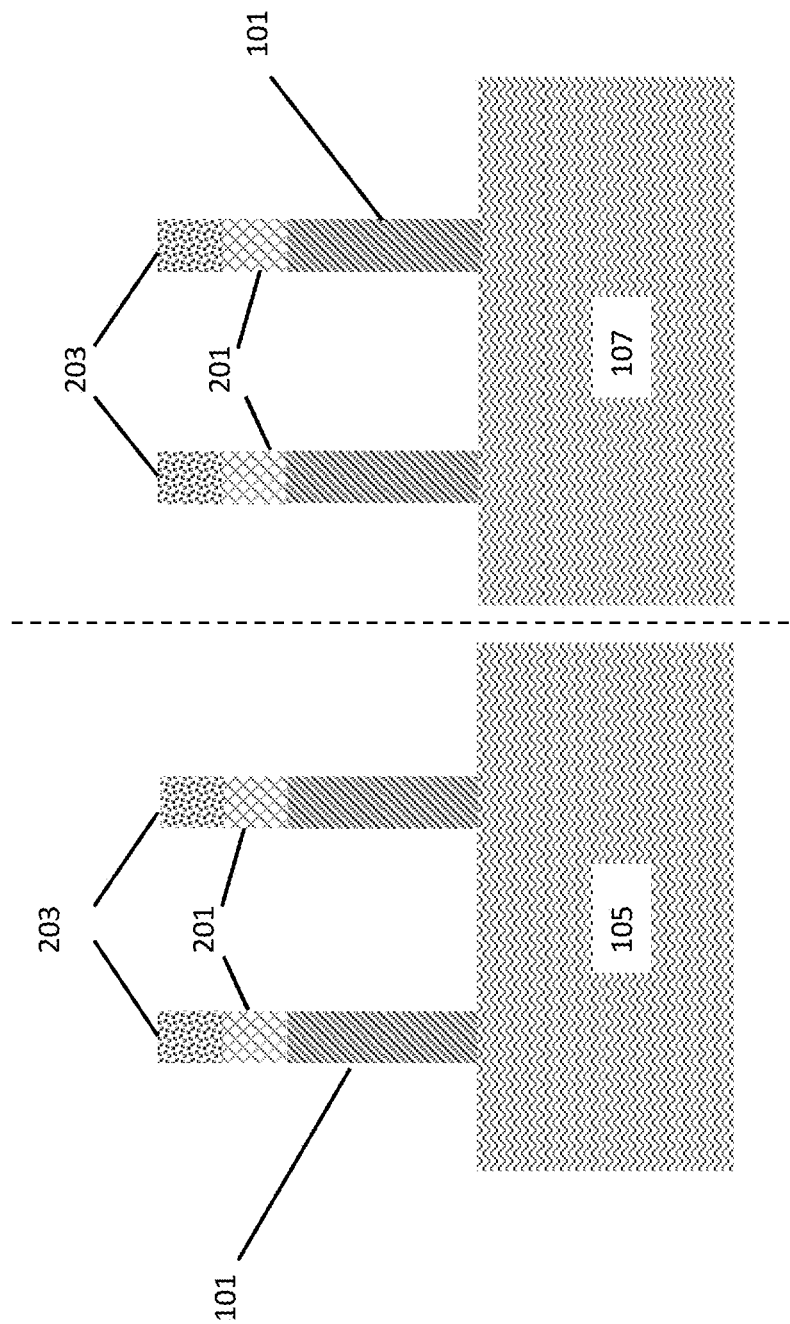

Adverting to FIG. 2, a thermal oxide layer 201 is formed over the fins 101, and a nitride layer 203 is formed over the thermal oxide layer 201.

Figure 3:
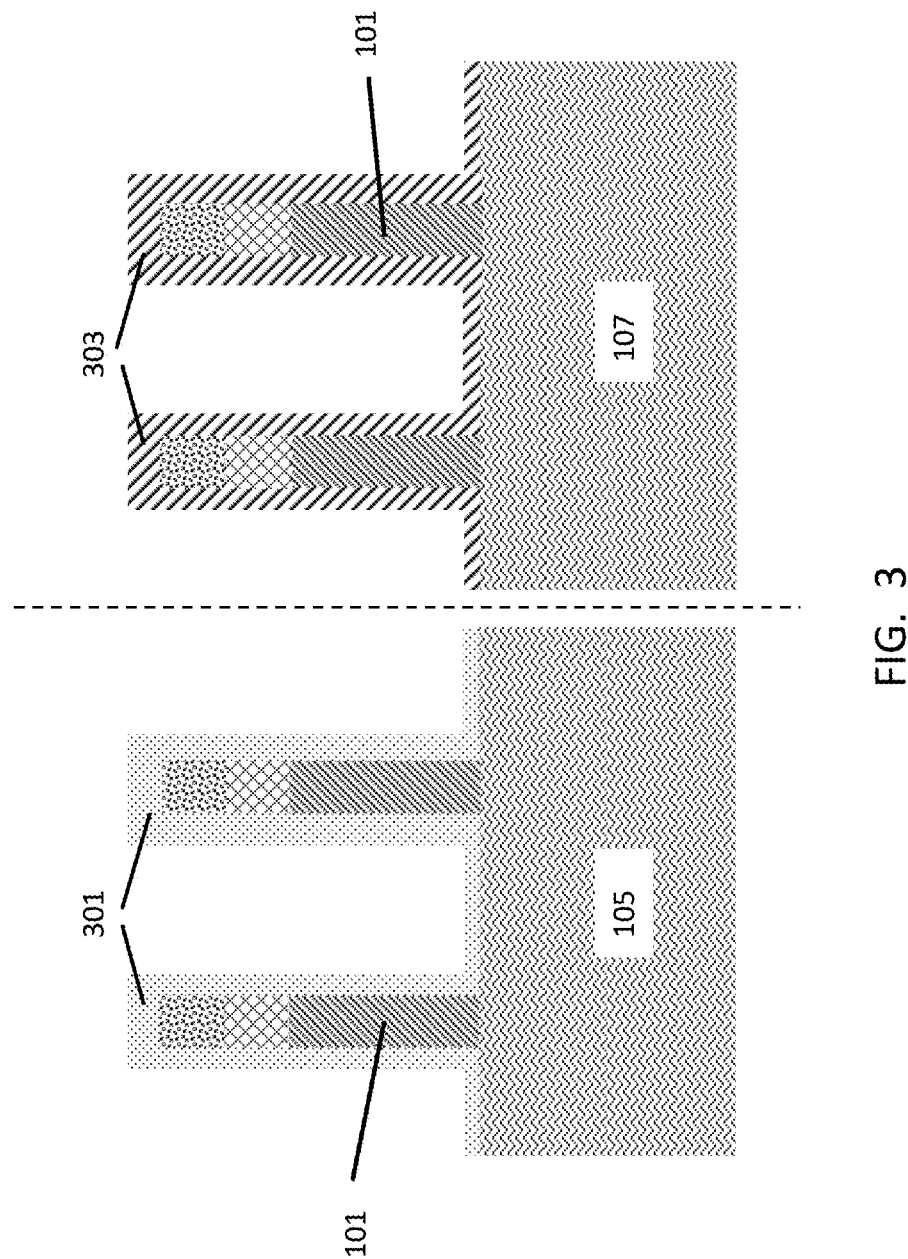

Adverting to FIG. 3, silica glass layers 301 and 303 are formed over portions 105 and 107, respectively, of the substrate 103. Specifically, the silica glass layers 301 and 303 are formed on and over (surrounding) an area including the fins 101. The silica glass 301 and 303 may be deposited over the fins 101 and etched back such that the silica glass 301 and 303 remain in an area surrounding the fins 101 and serve as a liner cap over the fins 101. The formed silica glass layer 301 includes a p-type dopant such as B. The dopant type is p-type and the silica glass may be formed of BSG, or B doped silicon glass. The formed silica glass layer 303 includes an n-type dopant such as P. The dopant type is n-type and the silica glass may be formed of PSG, or P doped silicon glass. The silica glass 301 and 303 may be deposited by chemical vapor deposition (CVD), PECVD, or physical vapor deposition (PVD) to a thickness of 500 Å to 1000 Å.

Figure 4:
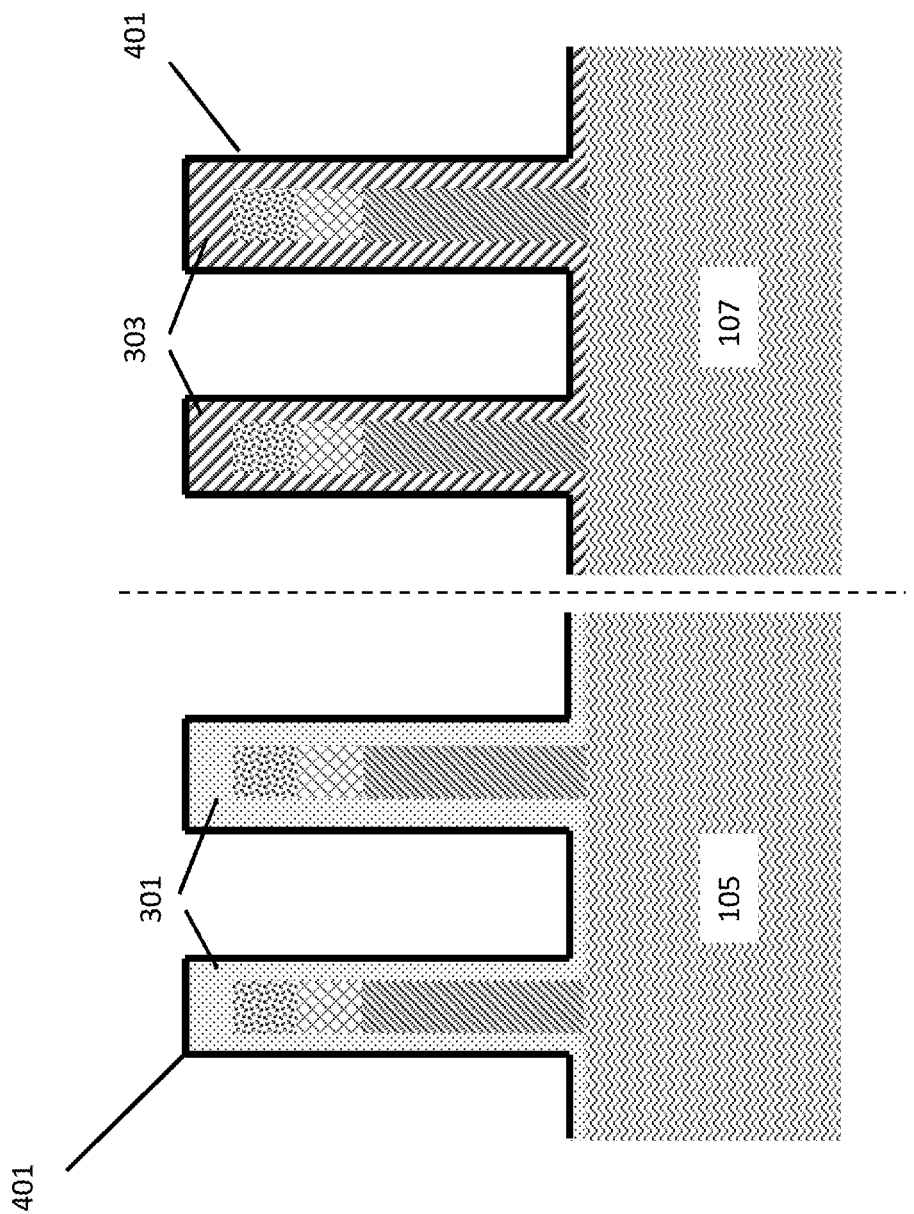

Adverting to FIG. 4, a thin SiOC film 401 is deposited over the BSG 301 and PSG 303 liner caps. The SiOC film 401 is a thin, low dielectric constant (low-k) material that caps and prevents the boron and phosphorous dopants from escaping from the fins 101. The SiOC film 401 can be deposited with a PECVD or LPCVD to a thickness of 20 to 60 Å.

The substrate 103 is subjected to high temperature processing, such as annealing at a temperature between 500 to 1000° C. The annealing can include a rapid thermal anneal (RTA) process that is performed at approximately 1000° C. for approximately 10 seconds. The anneal process may drive the dopants into the fins 101. The anneal process allows solid phase diffusion (drive-in) of dopants from the BSG and PSG liner caps 301 and 303 into the fins 101. Additional processing may continue for the fabrication of one or more gate structures on the substrate 103.

The SiOC film 401 provides a higher resistance to oxidation from plasma, annealing, and is resistant to wet etching. In addition, the SiOC layer 401 is substantially conformal and provides a hermetic seal to prevent dopant diffusion. As such, the SiOC film 401 is a diffusion barrier film that prevents dopant diffusion between layers. Further, the SiOC film 401 has a superior dry etch for selectivity to silicon and nitride. The SiOC film 401 prevents oxidation of underlying layers during post processing. The SiOC layer 401 is a thermally stable film, and no carbon loss is observed after RTA.

Devices formed in accordance with embodiments of the present disclosure enjoy utility in various industrial applications, e.g., microprocessors, smart-phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in the manufacture of any of various types of highly integrated semiconductor devices having fins with a diffusion barrier film which retains dopants in the fins during high temperature post processing. The present disclosure is particularly applicable to the 10 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming silicon fins over a substrate;
   depositing a borosilicate glass (BSG) liner cap over a first set of the silicon fins;
   depositing a phosphosilicate glass (PSG) liner cap over a second set of the silicon fins; and
   depositing a silicon oxycarbide (SiOC) diffusion barrier film over the BSG and PSG liner caps.

2. The method according to claim 1, further comprising:
   annealing the silicon fins between 500 to 1000° C.

3. The method according to claim 2, comprising depositing the SiOC film including:
   depositing the SiOC film with plasma-enhanced chemical vapor deposition (PECVD).

4. The method according to claim 2, comprising depositing the SiOC film including:
   depositing the SiOC film with low-pressure chemical vapor deposition (LPCVD).

5. The method according to claim 1, further comprising:
depositing a thermal oxide over the silicon fins prior to depositing the BSG and PSG liner caps.

6. The method according to claim 5, further comprising:
depositing a nitride over the thermal oxide prior to depositing the BSG and PSG liner caps.

7. The method according to claim 1, wherein the SiOC diffusion barrier film is a low dielectric constant material.

8. The method according to claim 1, comprising depositing the SiOC diffusion barrier film as a conformal layer over the BSG and PSG liner caps.

9. The method according to claim 8, comprising depositing the SiOC diffusion barrier film to a thickness of 20 to 60 Å.

10. The method according to claim 1, comprising forming the first set of the silicon fins over a p-well region of the substrate.

11. The method according to claim 1, comprising forming the second set of the silicon fins over an n-well region of the substrate.

12. A device comprising:
silicon fins formed over a substrate;
a borosilicate glass (BSG) liner cap formed over a first set of the silicon fins;
a phosphosilicate glass (PSG) liner cap formed over a second set of the silicon fins; and
a silicon oxycarbide (SiOC) diffusion barrier film formed over the BSG and PSG liner caps.

13. The device according to claim 12, further comprising:
a thermal oxide formed over the silicon fins under the BSG and PSG liner caps.

14. The device according to claim 13, further comprising:
a nitride formed over the thermal oxide and under the BSG and PSG liner caps.

15. The device according to claim 12, wherein
the SiOC diffusion barrier film is a low dielectric constant material.

16. The device according to claim 15, wherein
the SiOC diffusion barrier film is deposited as a conformal layer over the BSG and PSG liner caps.

17. The device according to claim 12, wherein
the SiOC diffusion barrier film is deposited to a thickness of 20 to 60 Å.

18. The device according to claim 12, wherein
the first set of the silicon fins is formed over a p-well region of the substrate.

19. The device according to claim 12, wherein
the second set of the silicon fins is formed over an n-well region of the substrate.

20. A method comprising:
forming silicon fins over a substrate;
depositing a thermal oxide over the silicon fins;
depositing a nitride over the thermal oxide;
depositing a borosilicate glass (BSG) liner cap over a first set of the silicon fins;
depositing a phosphosilicate glass (PSG) liner cap over a second set of the silicon fins; and
depositing a low-k silicon oxycarbide (SiOC) diffusion barrier film over the BSG and PSG liner caps.

* * * * *